(12) United States Patent
Oh et al.

(10) Patent No.: US 7,511,782 B2
(45) Date of Patent: Mar. 31, 2009

(54) LIQUID CRYSTAL DISPLAY DEVICE AND FABRICATION METHOD HAVING OPEN GATE/DATA PADS WITH TRANSPARENT CONDUCTIVE LAYER THEREON TO AN EDGE THEREOF

(75) Inventors: Kwang Sik Oh, Kyongsangbuk-do (KR); Myung Woo Nam, Kyongsangbuk-do (KR); Ki Du Cho, Kumi-shi (KR); Se Jong Shin, Taegu-kwangyokshi (KR); Bong Chul Kim, Taegu-kwangyokshi (KR); Kwon Seob Choi, Cheongju-shi (KR)

(73) Assignee: LG Display Co., Ltd., Seoul (KR)

( * ) Notice: Subject to any disclaimer, the term of this patent is extended or adjusted under 35 U.S.C. 154(b) by 385 days.

(21) Appl. No.: 11/091,477

(22) Filed: Mar. 29, 2005

(65) Prior Publication Data

US 2005/0219433 A1  Oct. 6, 2005

(30) Foreign Application Priority Data

Apr. 1, 2004  (KR) ............... 10-2004-0022625

(51) Int. Cl.
*G02F 1/1343* (2006.01)
(52) U.S. Cl. .................. 349/43; 349/46; 349/149
(58) Field of Classification Search .......... 349/42, 349/43, 46, 149; 438/30
See application file for complete search history.

(56) References Cited

U.S. PATENT DOCUMENTS

| | | | |
|---|---|---|---|
| 5,034,340 A * | 7/1991 | Tanaka et al. ............ 438/158 |
| 5,672,523 A * | 9/1997 | Yamamoto et al. ........ 438/396 |
| 6,288,764 B1 * | 9/2001 | Zhang et al. ............. 349/152 |
| 6,406,946 B1 * | 6/2002 | Takizawa et al. ......... 438/149 |
| 7,016,009 B2 * | 3/2006 | Lee ......................... 349/187 |
| 2003/0122978 A1 | 7/2003 | Lim | |
| 2004/0018655 A1 * | 1/2004 | Song ......................... 438/30 |

FOREIGN PATENT DOCUMENTS

| KR | 10-2002-0038023 A | 5/2002 |
|---|---|---|
| KR | 10-2002-0076449 A | 10/2002 |
| KR | 10-2003-0057208 A | 7/2003 |
| WO | WO 03/085448 A1 | 10/2003 |

* cited by examiner

*Primary Examiner*—David Nelms
*Assistant Examiner*—John Heyman
(74) *Attorney, Agent, or Firm*—McKenna Long & Aldrige LLP

(57) ABSTRACT

An LCD device and a method for manufacturing the same is disclosed in which the manufacturing process is simplified by etching an overcoat layer and a lower insulating layer at the same time. Disclosed is a method for manufacturing the LCD device that includes forming a thin film transistor (TFT) on an active region of a substrate, forming a gate pad region and data pad region, and forming a passivation layer on the entire surface of the substrate. The manufacturing method further includes forming an overcoat layer and selectively etching the overcoat layer. Contact holes for the pixel electrode, the gate pad, and the data pad are formed by selectively etching the overcoat layer, the passivation layer, and the gate insulating layer though one process.

20 Claims, 21 Drawing Sheets

US 7,511,782 B2

LIQUID CRYSTAL DISPLAY DEVICE AND FABRICATION METHOD HAVING OPEN GATE/DATA PADS WITH TRANSPARENT CONDUCTIVE LAYER THEREON TO AN EDGE THEREOF

This application claims the benefit of the Korean Application No. P2004-22625 filed on Apr. 1, 2004, which is hereby incorporated by reference for all purposes as if fully set forth herein.

BACKGROUND OF THE INVENTION

1. Field of the Invention

The present invention relates to a liquid crystal display (LCD) device, and more particularly, to an LCD device in which a color filter array and a TFT array are formed on one substrate.

2. Discussion of the Related Art

Recently, LCD devices have gained in popularity as flat display devices, due to advantageous characteristics such as high contrast ratio, excellent gray level, high picture quality, and low power consumption. For example, LCD devices may be used in ultra-thin display device applications, such as wall-mountable televisions. Also, LCD devices are generally light in weight and consume low power compared to CRTs (Cathode Ray Tubes), and LCD devices can be used in notebook computers operated by battery. As such, LCD devices are generally considered to be the next generation display device.

In general, an LCD device includes a thin film transistor (TFT) array substrate and a color filter array substrate. In more detail, a plurality of gate and data lines are formed on the TFT array substrate, wherein each of the gate lines is oriented perpendicularly to each of the data lines, defining a unit pixel region. A TFT and a pixel electrode are formed in each of the pixel regions. Further, the color filter array substrate includes a color filter layer and a common electrode.

In forming a LCD device, the TFT array substrate is positioned opposite the color filter array substrate, and the two substrates are bonded to each other. Then, a liquid crystal layer having dielectric anisotropy is formed between the TFT array substrate and the color filter array substrate. The color filter array substrate and the TFT array substrate are bonded to each other by a sealant, which is formed of epoxy resins. Further, a driving circuit on a PCB (Printed Circuit Board) is connected with a TCP (Tape Carrier Package) to the TFT array substrate.

In operation, a voltage is applied to a particular pixel region by switching the corresponding thin film transistor TFT formed in a particular pixel region by selecting the corresponding gate line and data line.

FIG. 1 is a plan view illustrating a related art LCD device. As illustrated in FIG. 1, a TFT array substrate 11 includes an active region 60 and a pad region 61. In the active region 60 of the TFT array substrate 11, a plurality of gate lines 12 and a plurality of data lines 15 are formed to define a plurality of pixel regions, wherein each gate line 12 is perpendicular to each data line 15. A thin film transistor (TFT) (not shown) is formed at a crossing point of the gate line 12 and the data line 15, and a pixel electrode (not shown) is formed in each pixel region.

In the pad region 61 of the TFT array substrate 11, there are a plurality of gate pads 22 and a plurality of data pads 25. The gate pads 22 extend from the gate lines 12 to apply a gate driving signal from a gate driver to each gate line 12. Also, the data pads 25 extend from the data lines 15 to apply a data driving signal from a data driver to each data line 15. Accordingly, the plurality of gate pads 22 and data pads 25 interface with respective external driving circuits. For driving the LCD device, the gate pad 22 and the data pad 25 respectively provide connection for a driving signal between the driving circuit and the gate lines 12 and data lines 15. In this case, data input signals outputted from the driving circuit are divided according to a control signal and are then supplied to the respective pixel regions.

Although not shown, a black matrix layer is formed on the active region of the color filter array substrate for selectively blocking the light such that only the pixel regions are transmissive. A color filter layer is formed on the color filter array substrate in correspondence with the pixel regions. Then, the TFT array substrate is bonded to the color filter array substrate at a predetermined interval between them, and then a liquid crystal layer is formed between the TFT array substrate and the color filter array substrate.

Light leakage may occur due to misalignment between the thin film transistor TFT array substrate and the color filter array substrate. To solve this problem, the black matrix layer is formed to cover the edge of the pixel region. However, in doing so, the aperture ratio of the LCD device is sharply lowered. In order to overcome this problem, a TOC (TFT On Color Filter) type or a COT (Color Filter On TFT) type LCD device, in which a color filter array and a TFT array are formed on one substrate, has been introduced.

FIG. 2A is a cross sectional view illustrating an active region and a gate pad region in a COT type LCD device according to the related art. FIG. 2B is a cross sectional view illustrating an active region and a data pad region in a COT type LCD device according to the related art. FIG. 3A to FIG. 3F are cross sectional views illustrating manufacturing process steps for a gate pad region of a COT type LCD device according to the related art. FIG. 4A to FIG. 4F are cross sectional views illustrating manufacturing process steps for a data pad region of a COT type LCD device according to the related art.

In the COT type LCD device, as illustrated in FIG. 2A and FIG. 2B, a substrate 111 is divided into an active region and a pad region. A color filter layer 135 and a thin film transistor TFT are formed in the active region. The pad region includes a gate pad 122 and a data pad 125. On the active region of the substrate 111, a gate line (not shown), a gate insulating layer 113, a semiconductor layer 114, a data line (not shown), source/drain electrodes 115a/115b, and a passivation layer 116 are deposited in sequence. The gate line (not shown) having a gate electrode 112a is formed at one direction on the substrate 111, and the gate insulating layer 113 is formed on an entire surface of the substrate 111 including the gate line. Then, the semiconductor layer 114 is formed on the gate insulating layer 113 above the gate electrode 112a. The data line is formed perpendicularly to the gate line, and the source/drain electrodes 115a/115b are overlapped at opposite ends of the semiconductor layer 114 relative to the gate electrode 112a. Thereafter, a passivation layer 116 is formed on the entire surface of the substrate 111 including the source/drain electrodes 115a/115b. With this structure, a thin film transistor TFT is formed by the gate electrode 112a, the gate insulating layer 113, the semiconductor layer 114, and the source/drain electrodes 115a/115b.

In the aforementioned structure, a black matrix layer 134 is formed on the passivation layer 116 above the gate line and the data line to prevent light from being transmitted anywhere except through the pixel region. Further, an R/G/B color filter layer 135 of R/G/B is formed on the passivation layer 116 of the pixel region. Then, an overcoat layer 136 is formed on the entire surface of the substrate including the color filter layer 135 for forming a substantially uniformly planar surface on the substrate. In addition, a pixel electrode 117 is formed on the overcoat layer 136 of the pixel region, wherein the pixel electrode 117 is electrically connected with the drain electrode 115*b* of the TFT.

The pixel electrode 117 is in contact with the drain electrode 115*b* through a contact hole 118, wherein the contact hole 118 is formed by removing a portion of the passivation layer 116 and the overcoat layer 136. According to the related art, the step of removing the passivation layer 116 is done separately from the step of removing the overcoat layer 136.

The gate pad region includes the gate pad 122, the gate insulating layer 113, the passivation layer 116, the overcoat layer 136, and a first transparent conductive layer 127. The gate pad 122 extends from the gate line (not shown). Also, the gate insulating layer 113 and the passivation layer 116, which includes a first pad open region 128, are sequentially formed on the gate pad 122. Then, the overcoat layer 136 is formed on the predetermined portion of the passivation layer 116, and the first transparent conductive layer 127 is formed in contact with the gate pad 122 through the first pad open region 128.

Referring to FIG. 2B, the data pad region includes the data pad 125, the passivation layer 116, the overcoat layer 136, and a second transparent conductive layer 137. The data pad 125 extends from the data line (not shown), and the passivation layer 116, which includes a second pad open region 138, is deposited on the data pad 125. Also, the overcoat layer 136 is formed on the predetermined portion of the passivation layer 116, and the second transparent conductive layer 137 is in contact with the data pad 125 through the second pad open region 138. In this case, the pixel electrode 117 and the first/second transparent conductive layers 127/137 are formed of the same material. A sealant 140 is formed in the interface between the active region and the pad region, on the passivation layer 116, and between the overcoat layer 136 and the first/second transparent conductive layers 127/137.

A method for manufacturing the related art LCD device is described as follows. First, as illustrated in FIG. 3A and FIG. 4A, a low-resistance metal material is deposited on the transparent glass substrate 111 by sputtering, and is then patterned by photolithography, thereby forming the gate line (not shown), the gate electrode 112*a*, and the gate pad 122. Next, an inorganic insulating material such as silicon oxide $SiO_x$ or silicon nitride $SiN_x$ is deposited on the entire surface of the substrate 111 including the gate electrode 112*a*, thereby forming the gate insulating layer 113.

After that, as illustrated in FIG. 3B and FIG. 4B, an amorphous silicon layer and a low-resistance metal layer are sequentially deposited and patterned on the gate insulating layer 113, thereby forming the semiconductor layer 114, the data line (not shown), the source/drain electrodes 115*a*/115*b*, and the data pad 125. Although not shown, it is possible to form the semiconductor layer 114, the data line (not shown), the source/drain electrodes 115*a*/115*b*, and the data pad 125 by using a half-tone mask. Accordingly, the semiconductor layer 114 remains as a lower layer under the data line (not shown) and the data pad 125. Alternatively, after patterning the semiconductor layer without using the half-tone mask, a metal layer may be deposited and patterned on the semiconductor layer to form the data line, the source/drain electrodes 115*a*/115*b*, and the data pad 125. As a result, the thin film transistor TFT is formed from the structure having the gate electrode 112*a*, the gate insulating layer 113, the semiconductor layer 114, and the source/drain electrodes 115*a*/115*b* in the active region.

Subsequently, as illustrated in FIG. 3C and FIG. 4C, an inorganic insulating material layer is deposited on the entire surface of the substrate 111 including the source/drain electrodes 115*a*/115*b*, thereby forming the passivation layer 116. After that, the gate insulating layer 113 is selectively etched to form the first pad open region 128, and the passivation layer 116 is selectively dry-etched to form the contact hole 118 and the first/second pad open regions 128/138. In dry-etching the passivation layer 116, the source/drain metal material layers, positioned under the passivation layer 116, function as an etching stopper. The passivation layer 116 is selectively etched by the contact hole 118, thereby exposing the drain electrode 115*b* of the active region. The gate pad 122 is exposed in the first pad open region 128 by selectively etching the passivation layer 116 and the gate insulating layer 113. Also, the data pad 125 of the data pad region is exposed in the second pad open region 138 by selectively etching the passivation layer 116.

After that, as illustrated in FIG. 3D and FIG. 4D, an opaque organic material having a low dielectric constant is coated and patterned on the passivation layer 116, thereby forming the black matrix layer 134 to cover the TFT, the data line (not shown), and the gate line (not shown). Then, color resist is coated and patterned on the passivation layer 116 above the black matrix layer 134, according to a constant order, thereby forming the R/G/B color filter layer 135 in the pixel region. The TFT, the black matrix layer 134, and the color filter layer 135 are formed on one substrate eliminating the requirement for forming an additional black matrix layer and a color filter layer on an opposite substrate.

Subsequently, as illustrated in FIG. 3E and FIG. 4E, an organic insulating material, for example, BCB (Benzocyclobutene) or photoacryl, is coated on the entire surface of the substrate 111 including the color filter layer 135, thereby forming the overcoat layer 136. The overcoat layer 136 is formed to create a substantially planar surface on the entire substrate 111. In this respect, the overcoat layer 136 is essential to the COT type LCD device. Then, the overcoat layer 136 deposited in the contact hole 118 and in the first/second pad open region 128/138 is removed. Then, the black matrix layer 134 and the color filter layer 135 of the organic material, positioned on the contact hole 118, are removed at the same time, thereby exposing the drain electrode 115*b*.

After that, as illustrated in FIG. 3F and FIG. 4F, a transparent conductive material is deposited and patterned on the passivation layer 116, thereby forming the pixel electrode 117 in each pixel region, and simultaneously forming the first and second transparent conductive layers 127 and 137 on the respective gate pad and the data pad. The pixel electrode 117 is electrically connected with the drain electrode 115*b* through the contact hole 118, and the first and second transparent conductive layers 127 and 137 are electrically connected with the respective gate pad 122 and the data pad 125 through the first and second open pad regions 128 and 138. Afterwards, the sealant 140 is formed in the interface between the active region and the pad region in the LCD device, wherein the sealant 140 serves as an adhesive. After that, the substrate 111 is positioned opposite to another glass substrate (not shown), and the two substrates are bonded to each other. In this state, liquid crystal is injected between the two substrates, thereby completing the LCD device.

However, the related art LCD device and its manufacturing method have the following disadvantages. Forming the contact hole in the active region and the pad open region in the pad region requires multiple process of etching the gate insulating layer and the passivation layer as well as the subsequent process of patterning the overcoat layer. Accordingly, the preceding process and the subsequent process are separately performed in different devices, thereby complicating the manufacturing process.

SUMMARY OF THE INVENTION

Accordingly, the present invention is directed to a liquid crystal display panel and method of fabricating the same that substantially obviates one or more of the problems due to limitations and disadvantages of the related art.

Another advantage of the present invention is to provide an LCD device in which the manufacturing process is simplified.

An advantage of the present invention is to provide a liquid crystal device and a method for manufacturing the same, in which the number of processing steps are reduced by patterning a overcoat layer, a passivation layer, and a gate insulation layer in the same processing step.

To achieve these and other advantages and in accordance with the purpose of the present invention, as embodied and described herein, an LCD device comprises a gate line and a gate pad on a substrate; a gate insulating layer on an entire surface of the substrate including the gate line except the gate pad; a data line and a data pad on the gate insulating layer; a thin film transistor at a crossing portion of the gate line and the data line; a passivation layer on the entire surface of the substrate including the thin film transistor except the gate pad and data pad; an overcoat layer on the passivation layer, the overcoat layer; a pixel electrode in contact with the thin film transistor through a contact hole formed in the passivation layer and the overcoat layer; a first transparent conductive layer for contacting and covering the gate pad; and a second transparent conductive layer for contacting and covering the data pad.

To achieve these and other advantages and in accordance with the purpose of the present invention, as embodied and described herein, a method for manufacturing an LCD device comprises forming a gate line, a gate electrode, and a gate pad on a substrate; forming a gate insulating layer on an entire surface of the substrate including the gate line; forming a semiconductor layer on the gate insulating layer above the gate electrode; forming a data line, a source electrode, a drain electrode, and a data pad, wherein the data line is in perpendicular to the gate line; forming a passivation layer on the entire surface of the substrate including the data line; forming an overcoat layer on the entire surface of the substrate including the passivation layer; forming a contact hole, a first pad open region, and a second pad open region by selectively removing the overcoat layer, the passivation layer, and the gate insulating layer through one process; and forming a pixel electrode, a first transparent conductive layer, and a second transparent conductive layer, wherein the pixel electrode is in contact with the drain electrode through the contact hole, the first transparent conductive layer is in contact with the gate pad through the first pad open region, and the second transparent conductive layer is in contact with the data pad through the second pad open region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with description serve to explain the principles of the invention.

DETAILED DESCRIPTION OF THE ILLUSTRATED EMBODIMENTS

Reference will now be made in detail to exemplary embodiments of the present invention, examples of which are illustrated in the accompanying drawings.

Figure 1:
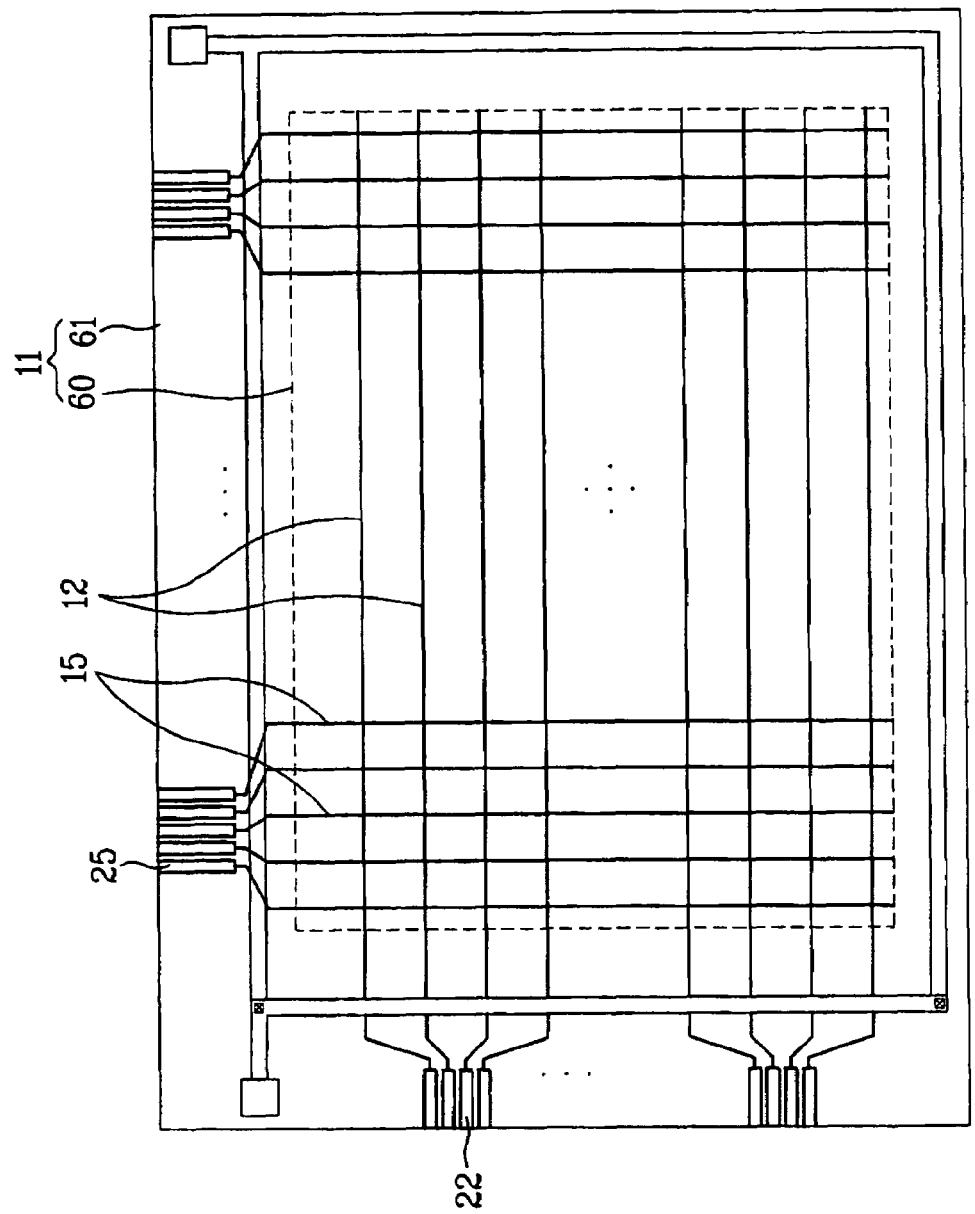
FIG. 1 is a plan view illustrating an LCD device according to the related art.
Figure 2A:
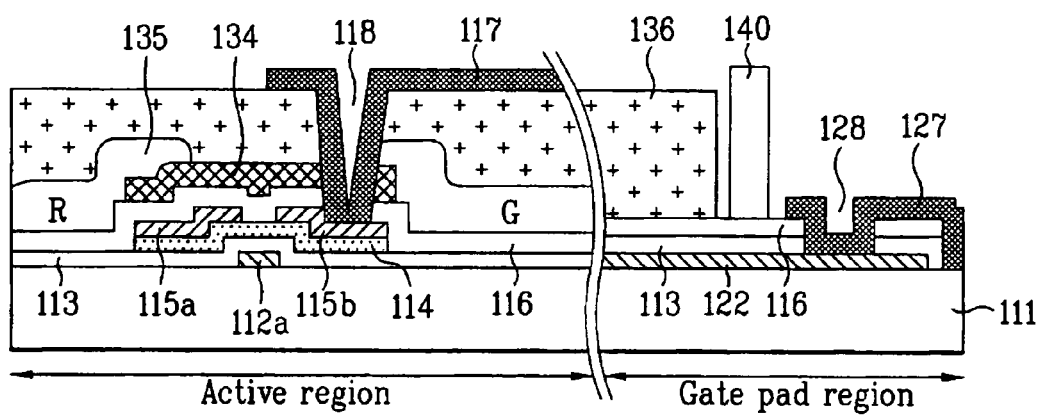
FIG. 2A and FIG. 2B are cross sectional views illustrating a COT type LCD device according to the related art.
Figure 2B:
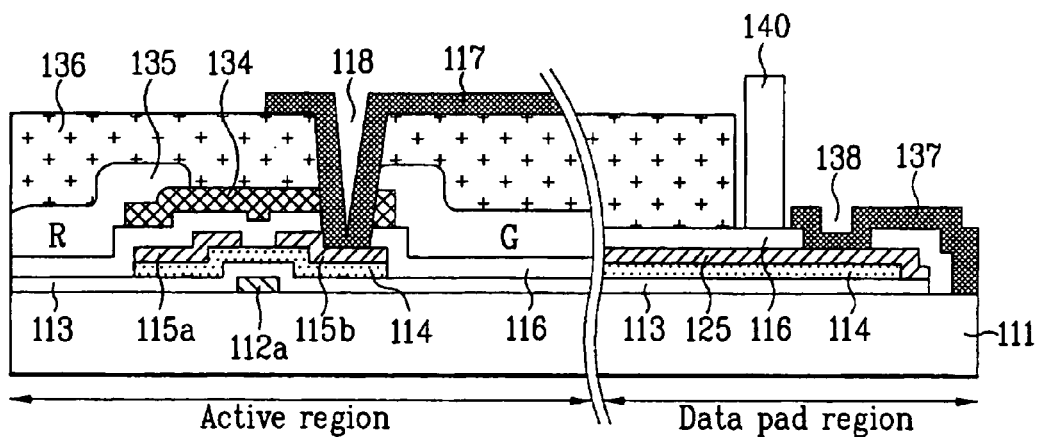
Figure 3A:
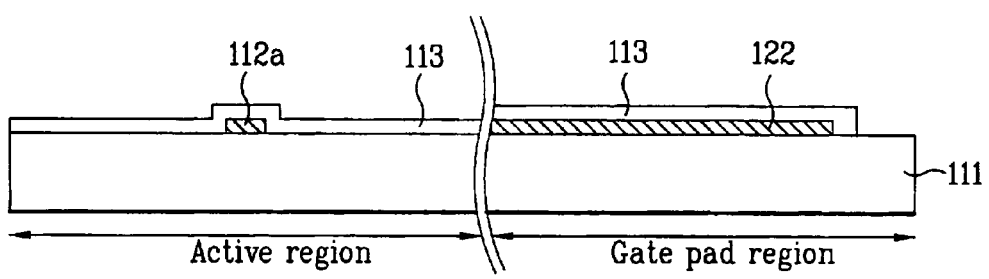
FIG. 3A to FIG. 3F are cross sectional views illustrating manufacturing process steps for a gate pad region of a COT type LCD device according to the related art.
Figure 3B:
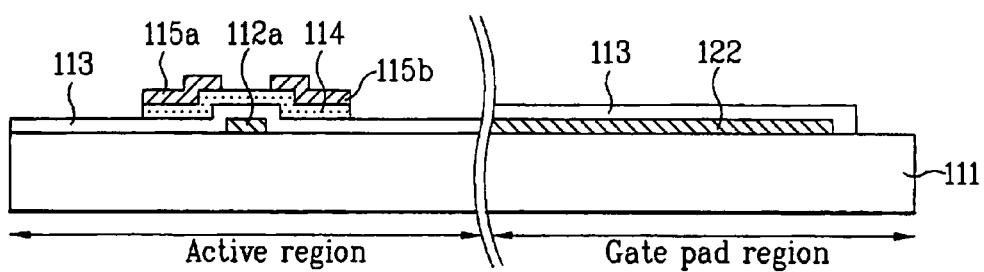
Figure 3C:
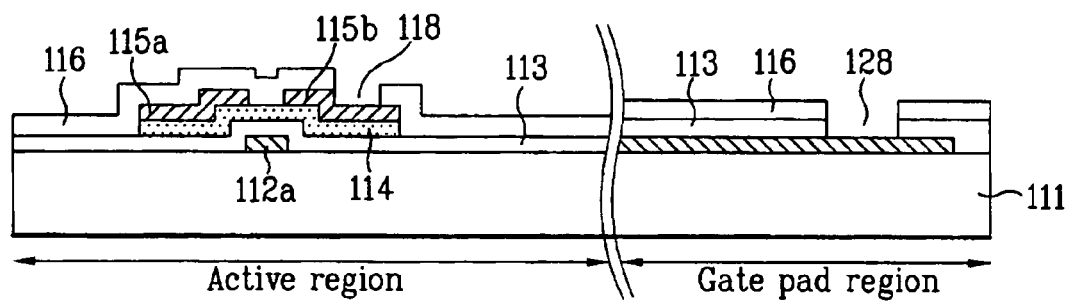
Figure 3D:
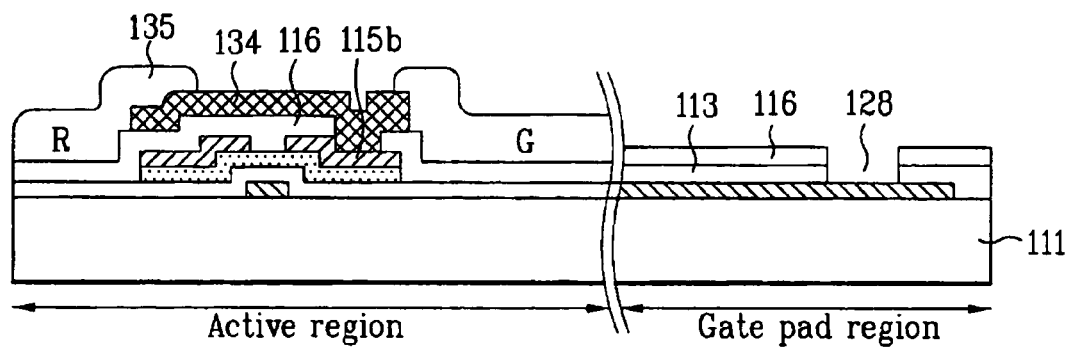
Figure 3E:
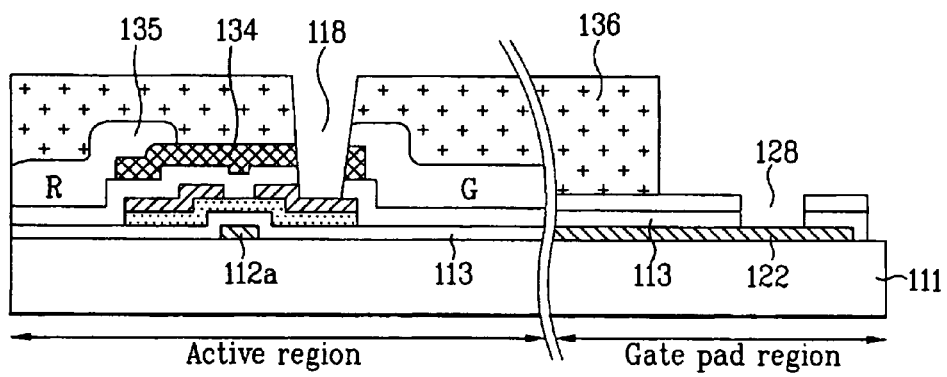
Figure 3F:
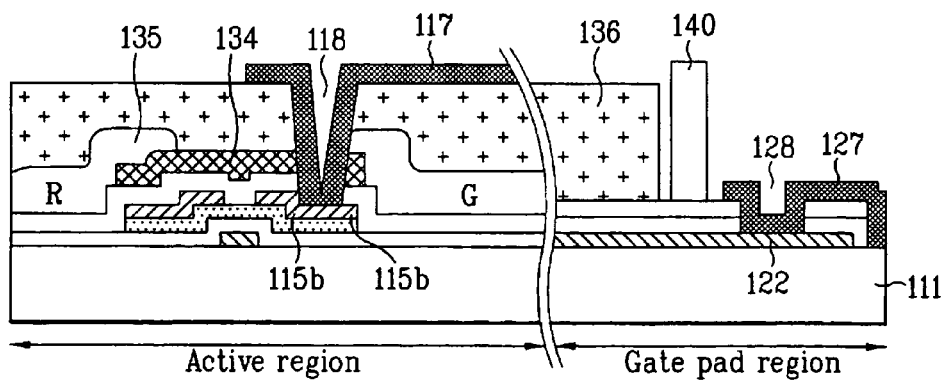
Figure 4A:
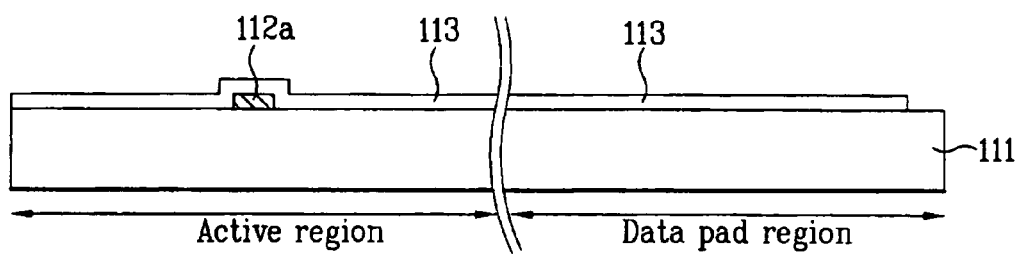
FIG. 4A to FIG. 4F are cross sectional views illustrating manufacturing process steps for a data pad region of a COT type LCD device according to the related art.
Figure 4B:
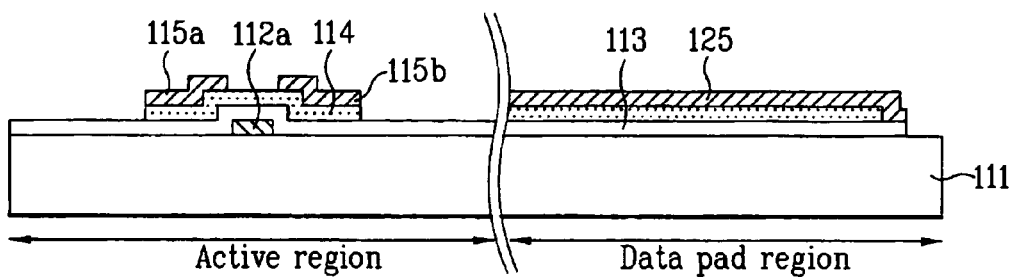
Figure 4C:
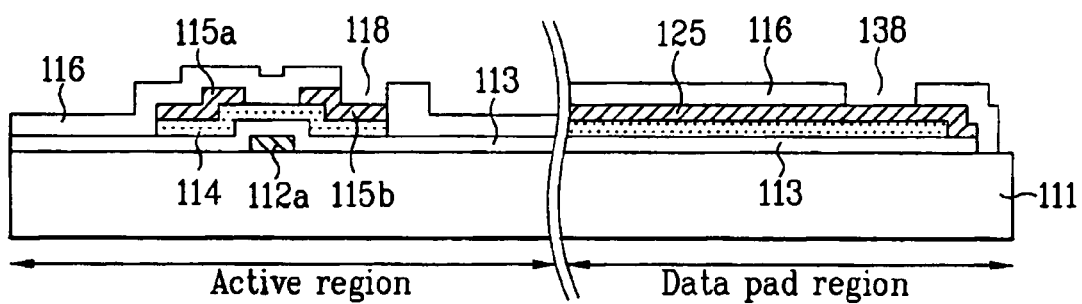
Figure 4D:
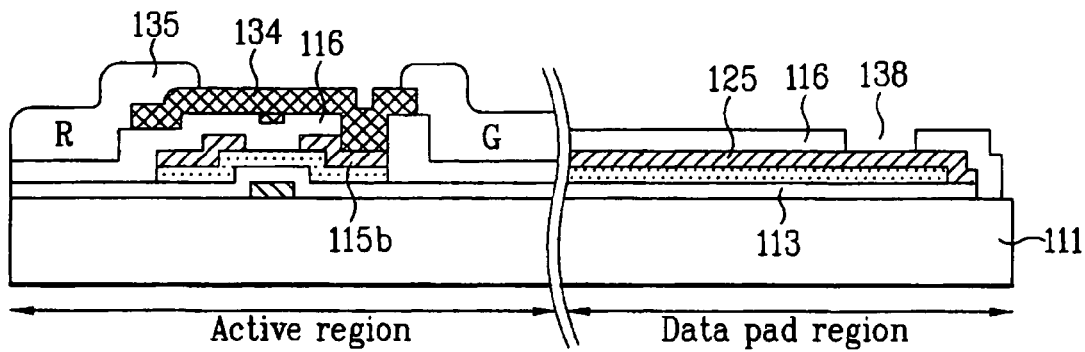
Figure 4E:
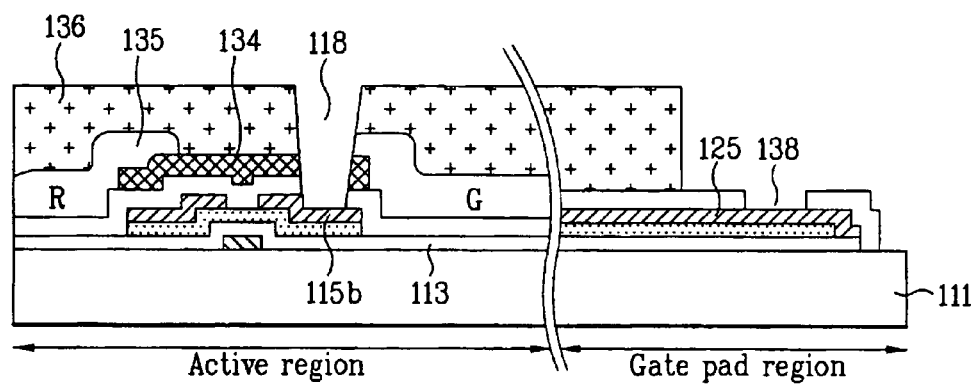
Figure 4F:
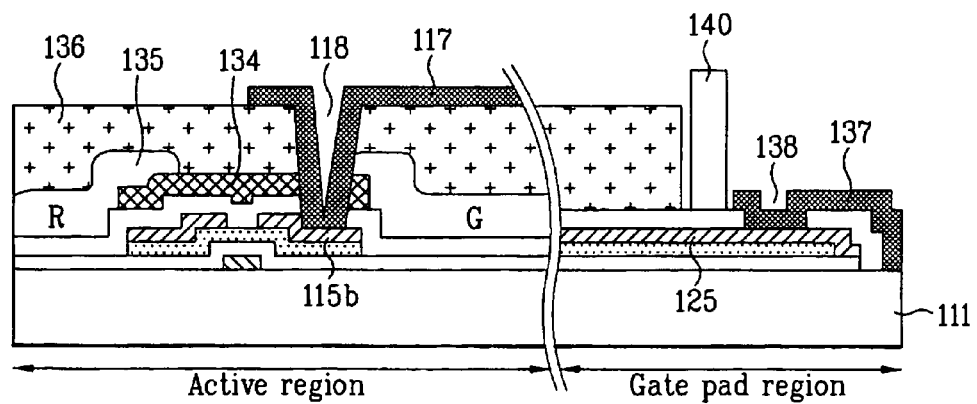
Figure 5A:
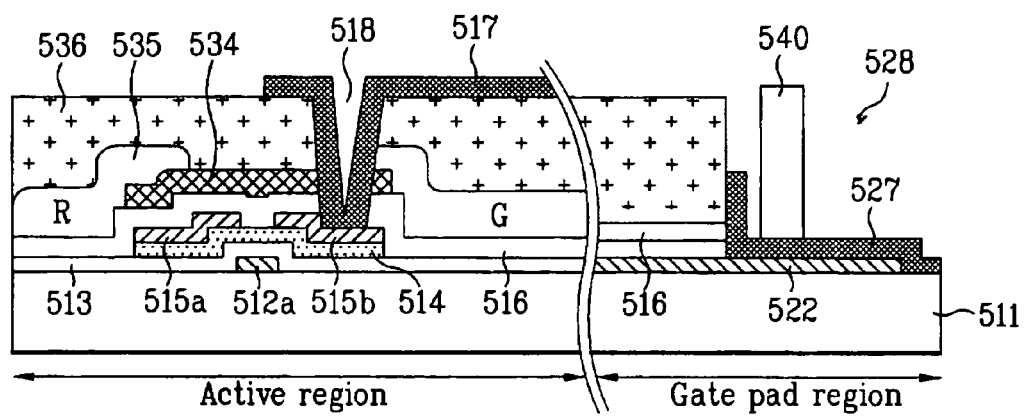
FIG. 5A and FIG. 5B are cross sectional views illustrating a COT type LCD device according to a first embodiment of the present invention.
Figure 5B:
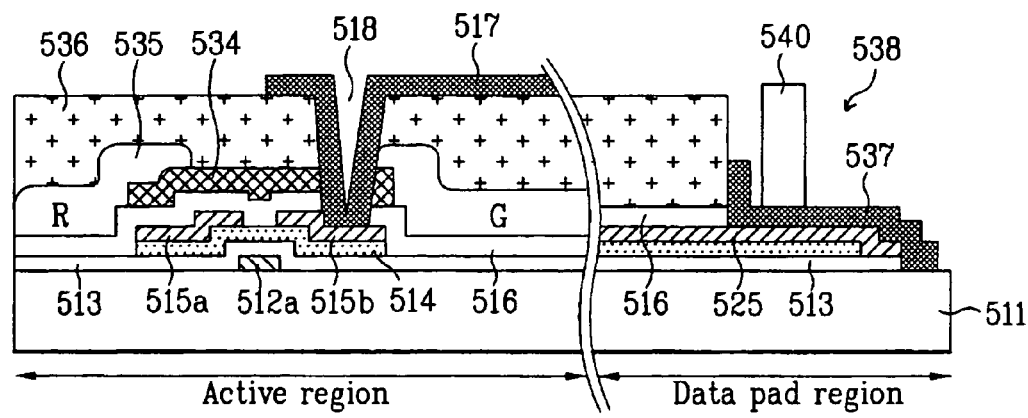

FIG. 5A and FIG. 5B are cross sectional views illustrating a COT type LCD device according to the first embodiment of the present invention. As illustrated in FIG. 5A and FIG. 5B, a color filter layer and a thin film transistor TFT are formed on one substrate 511. The substrate 511 includes an active region, a gate pad region, and a data pad region. The color filter layer 535 and the TFT are formed in the active region of the substrate 511. Also, a gate pad 522 is formed in the gate pad region, and a data pad 525 is formed in the data pad region.

Referring to FIG. 5A and 5B, on the active region of the substrate 511 are a gate line (not shown), a gate insulating layer 513, a semiconductor layer 514, a data line (not shown), source/drain electrodes 515a/515b, and a passivation layer 516. The gate line (not shown) having a gate electrode 512a is formed along one direction on the substrate 511, and the gate insulating layer 513 is formed on an entire surface of the substrate 511 including the gate line (not shown). The semiconductor layer 514 is disposed on the gate insulating layer 513 above the gate electrode 512a. The data line (not shown) is disposed perpendicularly to the gate line (not shown). The source/drain electrodes 515a/515b are formed such that they overlap both sides of the semiconductor layer 514. The passivation layer 516 is disposed on the entire surface of the substrate 511 including the source/drain electrodes 515a/515b. The resulting structure forms a TFT having the gate electrode 512a, the gate insulating layer 513, the semiconductor layer 514, and the source/drain electrodes 515a/515b.

A black matrix layer 534 for preventing incident light is disposed on the passivation layer 516 above the gate line and the data line and the TFT. Because the black matrix 534 is for blocking incident light, it is not formed on the pixel region. The R/G/B color filter layer 535 is disposed on the passivation layer 516 of the pixel region for displaying the color in each pixel region.

An overcoat layer 536 is formed on the entire surface of the substrate including the color filter layer 535 to provide a substantially planar surface on the entire surface of the substrate. A pixel electrode 517 is formed on the overcoat layer 536 of the pixel region, wherein the pixel electrode 517 is electrically connected with the drain electrode 515b of the thin film transistor. The pixel electrode 517 is in contact with the drain electrode 515b through a contact hole 518, wherein the contact hole 518 is formed by partially removing the passivation layer 516 and the overcoat layer 536. In the active region, the passivation layer 516 and the overcoat layer 536 have substantially the same pattern.

Referring to FIG. 5A, the gate pad region is formed of the gate pad 522 and a first transparent conductive layer 527. The gate pad 522 extending from the gate line (not shown) interfaces with an external driving circuit for providing gate signals to the gate lines of the LCD device. In addition, the first transparent conductive layer 527 covers the gate pad 522 for preventing the gate pad 522 from being directly exposed and being oxidized. The first transparent conductive layer 527 substantially covers the gate pad 522 otherwise exposed by a first pad open region 528. In the gate pad region, the gate insulating layer 513, the passivation layer 516, and the overcoat layer 536 have substantially the same pattern.

Referring to FIG. 5B, the data pad region includes the data pad 525 and a second transparent conductive layer 537, whereby the data pad 525 extends from the data line (not shown), The second transparent conductive layer 537 covers the data pad 525 by a second pad open region 538. In the data pad region, the passivation layer 516 and the overcoat layer 536 have substantially the same pattern.

An exemplary method for manufacturing the LCD device according to the first embodiment of the present invention will be described as follows. FIG. 6A to FIG. 6D are cross sectional views illustrating exemplary manufacturing process steps for the gate pad region of the COT type LCD device according to the first embodiment of the present invention. FIG. 7A to FIG. 7D are cross sectional views illustrating exemplary manufacturing process steps for the data pad region of the COT type LCD device according to the first embodiment of the present invention.

Figure 6A:
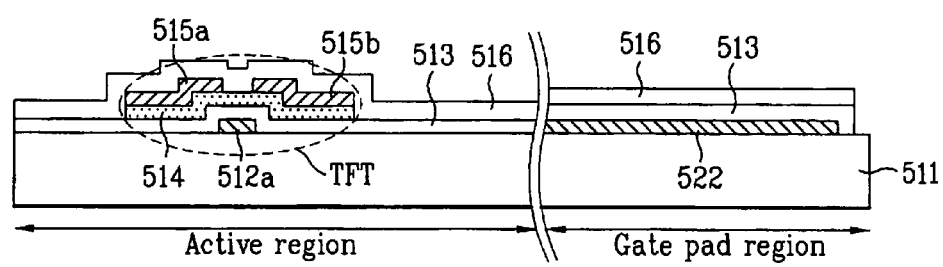
FIG. 6A to FIG. 6D are cross sectional views illustrating manufacturing process steps for a gate pad region of a COT type LCD device according to a first embodiment of the present invention.
Figure 7A:
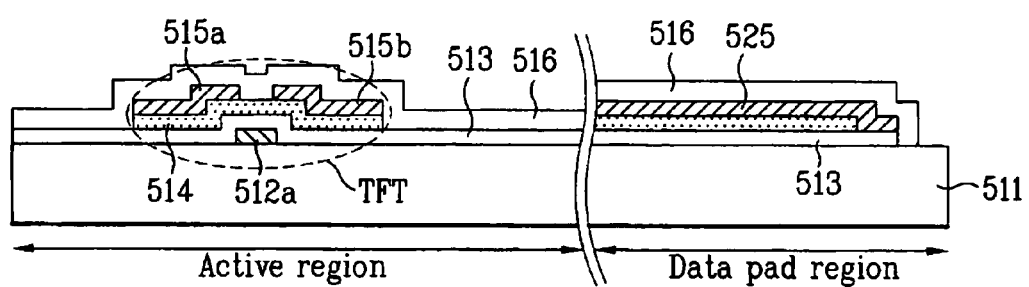
FIG. 7A to FIG. 7D are cross sectional views illustrating manufacturing process steps for a data pad region of a COT type LCD device according to a first embodiment of the present invention.

First, as illustrated in FIG. 6A and FIG. 7A, the transparent substrate 511 having a high working voltage is prepared. Then, a low-resistance metal material having a low resistivity, for example, below 15 $\mu\Omega cm^{-1}$, is deposited on the substrate 511. Exemplary low-resistance metals include copper Cu, aluminum Al, aluminum neodymium AlNd, molybdenum Mo, chrome Cr, titanium Ti, tantalum Ta, or molybdenum-tungsten MoW. Deposition may be done by sputtering, or another technique appropriate for depositing metals on a substrate. After that, the low-resistance metal material deposited on the substrate 511 is patterned by photolithography, thereby forming the gate line (not shown), the gate electrode 512, and the gate pad 522. Next, an inorganic insulating material having the suitable working voltage characteristics, for example, silicon oxide $SiO_x$ or silicon nitride $SiN_x$, is deposited on the entire surface of the substrate 511 including the gate electrode 512a by, for example, PECVD (Plasma Enhanced Chemical Vapor Deposition). In a particular embodiment, the inorganic insulating material is formed at a thickness of approximately 2000 Å.

After that, amorphous silicon (a-Si:H) is deposited on the gate insulating layer 513 by a deposition process such as PECVD with a mixing gas of $SiH_4$ and $H_2$. Then, a low-resistance metal material layer such as copper Cu, aluminum Al, aluminum neodymium AlNd, molybdenum Mo, chrome Cr, titanium Ti, tantalum Ta, or molybdenum-tungsten MoW, is deposited on the amorphous silicon layer. The deposited low-resistance metal material layer is patterned by photolithography with a half-tone mask, thereby forming the semiconductor layer 514, the data line (not shown), the source/drain electrodes 515a/515b, and the data pad 525. The metal material layer may be deposited and patterned after forming the semiconductor layer 514 to form the data line, the source/drain electrodes 515a/515b, and the data pad 525. That is, the semiconductor layer 514 and a data line layer may be formed at the same time, or the semiconductor layer 514 and the data line layer may be separately formed in different process steps. The gate electrode 512a, the semiconductor layer 514, and the source/drain electrodes 515a/515b of the active region together form the thin film transistor TFT. Subsequently, an inorganic insulating material having, for example, silicon oxide $SiO_x$ or silicon nitride $SiN_x$ is deposited on the entire surface of the substrate 511 including the thin film transistor TFT, thereby forming the passivation layer 516.

Figure 6B:
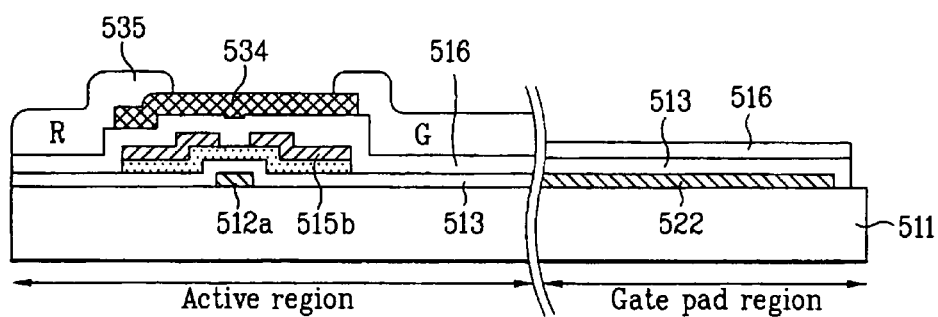
Figure 7B:
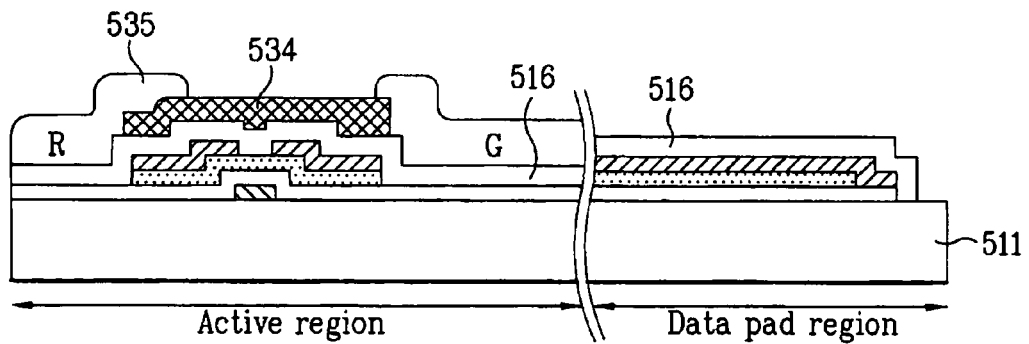

After that, as illustrated in FIG. 6B and FIG. 7B, an opaque organic material of carbon-type is coated on the passivation layer 516 and is patterned by photolithography, thereby forming the black matrix layer 534 on the substrate except the pixel region. The black matrix layer 534 is formed in correspondence with the margin of the unit pixel region (gate and data lines) and the TFT. An objective of the black matrix layer 534 is to prevent light leakage through the portion of the active region in which an electric field generated between the pixel electrode and a common electrode has instabilities or boundary effects. Then, a color resist having photosensitive characteristics is coated on the black matrix layer 534, and then light is selectively irradiated using a mask. After that, a desired pattern is formed with a developer, thereby forming the R/G/B color filter layer 535 in each pixel region. Generally, the black matrix layer 534 and the color filter layer 5345 are formed only in the active region.

Figure 6C:
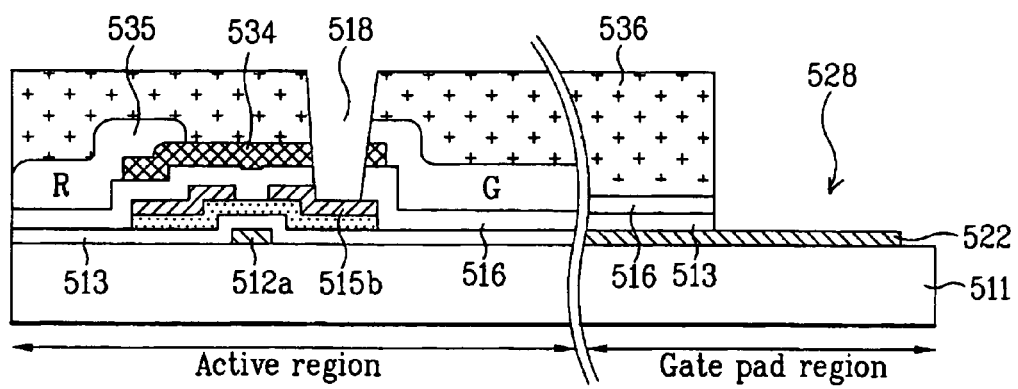
Figure 7C:
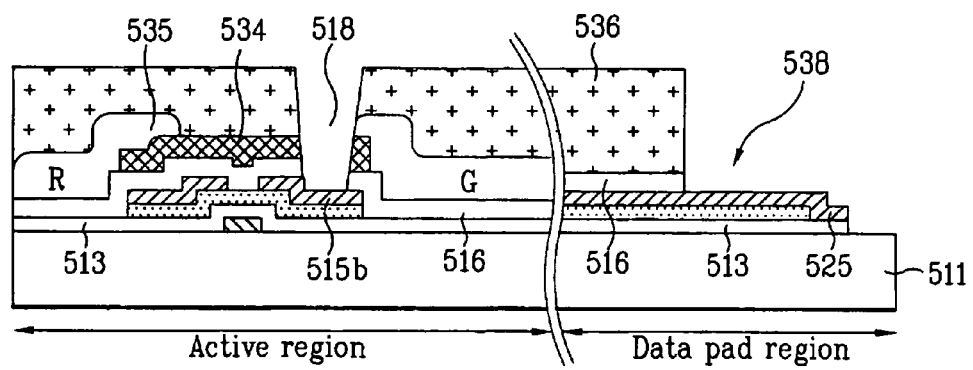

Next, as illustrated in FIG. 6C and FIG. 7C, the overcoat layer 536 is coated on the entire surface of the substrate including the color filter layer 535 for obtaining a substantially planar surface on the entire surface of the substrate. For forming the overcoat layer 536, an organic insulating material having photosensitive characteristics, such as photoacryl, is coated in a spin-coating method or a roll-coating method. The overcoat layer 536 functions as a layered substance and a photoresist (PR). Subsequently, light is irradiated onto the overcoat layer 536 using the mask, thereby forming the desired pattern. That is, the overcoat layer 536 is patterned to expose the passivation layer 516 positioned above the drain electrode 515b, the gate pad 522 and the data pad 532. Then, after developing the overcoat layer 536, the overcoat layer 536 may be cured in a method such as performing a first baking process at a temperature of approximately 120° for about 40 minutes and a second baking process at a temperature of approximately 200° for about 40 minutes.

The overcoat layer 536 may be formed of an organic insulating material having no photosensitive characteristics. In this case, the overcoat layer 536 may be patterned by using a photoresist layer pattern as a mask.

After that, the contact hole 518 and the first/second pad open regions 528/538 may be formed by dry-etching the passivation layer 516 and the gate insulating layer 513 exposed by the patterned overcoat layer 536. The lower metal layers such as the drain electrode 515b, the gate pad 522, and the data pad 525 may function as an etching stopper. In an exemplary dry-etching process, $Cl_2$ or F type gas particles are sprayed into an etching chamber in a high vacuum state so that the gas particles are transformed into a plasma state. In this state, the layered substance is etched by positive ion or radical transformed to the plasma state.

For the active region, the passivation layer 516 positioned above the drain electrode 515b is selectively etched, thereby forming the contact hole 518. In the gate pad region, the gate insulating layer 513 and the passivation layer 516, positioned above the gate pad 522, are selectively removed to form the first pad open region 528. In the data pad region, the passivation layer positioned above the data pad 525 is selectively etched, thereby forming the second pad open region 538. Accordingly, the passivation layer 516 and the overcoat layer 536 have substantially the same pattern in the active region and substantially the same pattern in the data pad region. Also, the gate insulating layer 513, the passivation layer 516, and the overcoat layer 536 have substantially the same pattern in the gate pad region. In this exemplary method, the gate insulating layer 513, the passivation layer 516, and the overcoat layer 536 are patterned in the same process, thereby simplifying manufacturing.

Figure 6D:
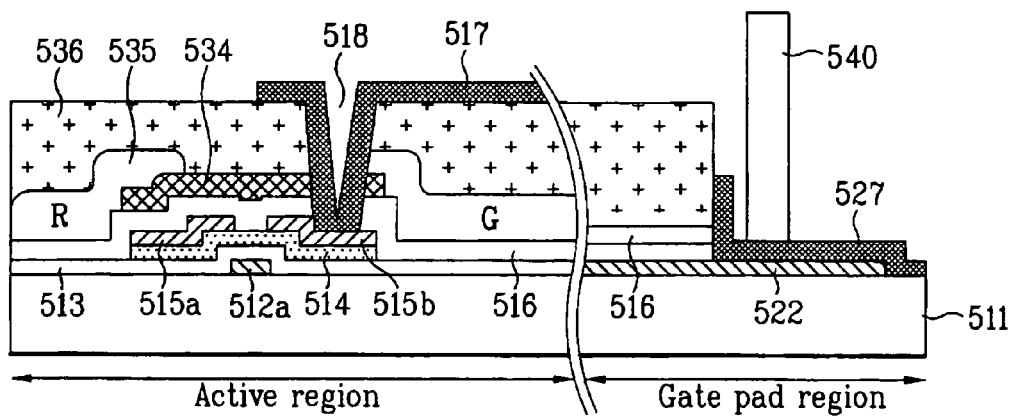
Figure 7D:
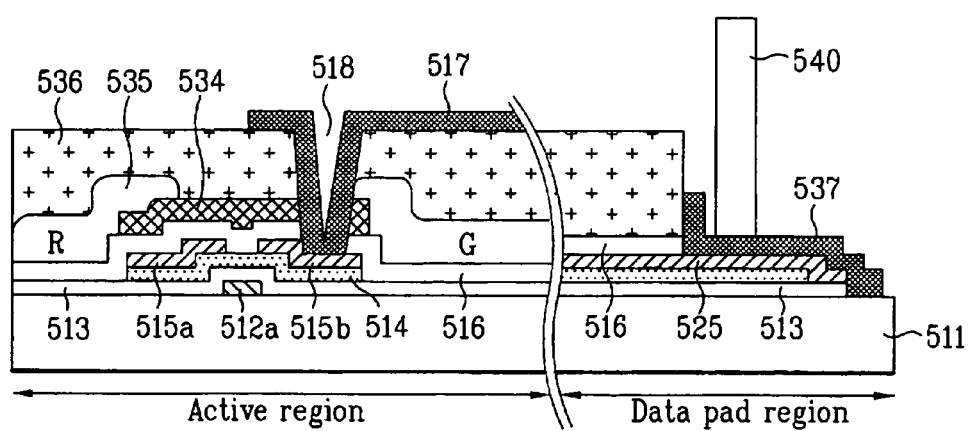

Next, as illustrated in FIG. 6D and FIG. 7D, a transparent conductive material such as ITO (indium tin oxide) or IZO (indium zinc oxide) is deposited and patterned on the entire surface of the substrate including the overcoat layer 536, thereby forming the first and second transparent conductive layers 527 and 537. The pixel electrode 517 is in contact with the drain electrode 515b through the contact hole 518. Also, the first and second transparent conductive layers 527 and 537 are respectively connected with the gate pad 522 and the data pad 525 through the first and second pad open regions 528 and 538.

After forming the sealant 540 of an adhesive on the first and second transparent conductive layers 527 and 537 of the pad region, the substrate 511 is positioned in opposite to another glass substrate (not shown), and then the two substrates are bonded to each other. After that, the liquid crystal layer is formed between the two substrates, thereby completing the LCD device according to the first embodiment of the present invention.

Figure 8:
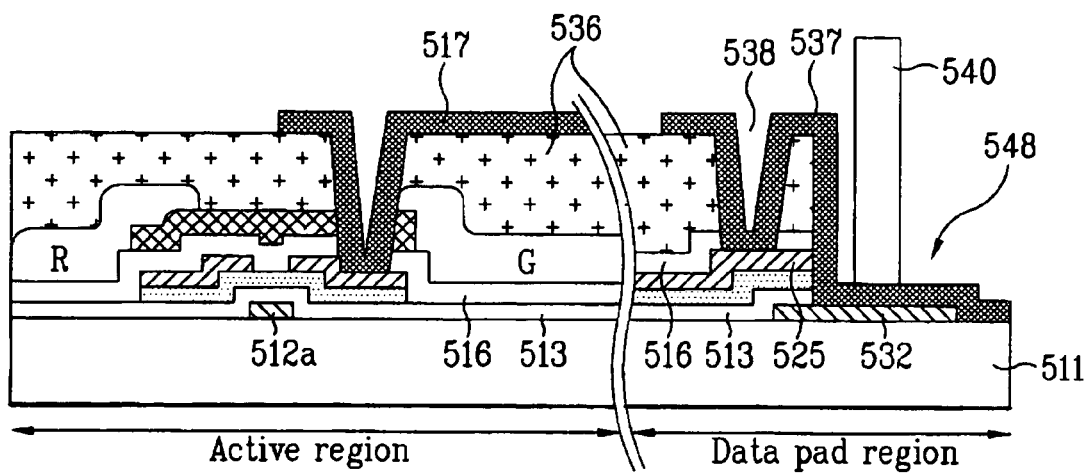
FIG. 8 is a cross sectional view illustrating a COT type LCD device according to a second embodiment of the present invention.

FIG. 8 is a cross sectional view illustrating a COT type LCD device according to a second embodiment of the present invention. FIG. 9A to FIG. 9D are cross sectional views illustrating manufacturing process steps for a data pad region of a COT type LCD device according to a second embodiment of the present invention. The LCD device according to the second embodiment of the present invention, in comparison with the first embodiment, further includes a gate metal 532 in a data pad region, as illustrated in FIG. 8. Accordingly, an active region and a gate pad region of the LCD device according to the second embodiment of the present invention are substantially similar to those of the LCD device according to the first embodiment of the present invention in structure and manufacturing process steps, and the primary differences pertain to the data pad region. In the drawings for the second embodiment of the present invention, the same or like parts as those in the first embodiment of the present invention will be referred to by the same reference numbers. In addition, the gate pad region will be explained with reference to FIG. 6A to FIG. 6D.

The LCD device according to the second embodiment of the present invention includes a substrate 511, the gate metal 532, a gate insulating layer 513, a data pad 525, a passivation layer 516, an overcoat layer 536, and a second transparent conductive layer 537. The gate metal 532 is additionally formed on the data pad region of the substrate 511. Also, the gate insulating layer 513 is formed on the substrate 511 and overlapping a portion of the gate metal 532. The data pad 525 extending from a data line (not shown) is formed on the gate insulating layer 513. The passivation layer 516 and the overcoat layer 536 are disposed on the data pad 525. The second transparent conductive layer 537 prevents the gate metal 532 from being exposed and being oxidized. In addition, the second transparent conductive layer 537 electrically connects the gate metal 532 with the data pad 525.

Herein, the gate metal 532 is formed substantially in an island shape and at the same layer as a gate line of the active region. The second transparent conductive layer 537 is in contact with the gate metal 532 through a third pad open region 548, and is also in contact with the data pad 525 through a second pad open region 538. The third pad open region 548 is formed by removing the gate insulating layer 513, the data pad 525, the passivation layer 516, and the overcoat layer 536, which are positioned above the gate metal 532. The second pad open region 538 is formed by removing the passivation layer 516 and the overcoat layer 536 positioned above the data pad 525. The gate insulating layer 513, the passivation layer 516, and the overcoat layer 536, which are positioned above the data pad 525, have substantially the same pattern.

An exemplary method for manufacturing the LCD device according to the second embodiment of the present invention is described as follows.

Figure 9A:
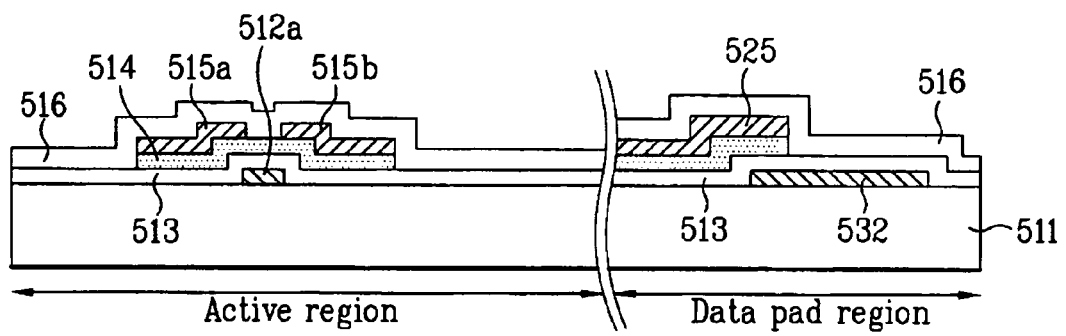
FIG. 9A to FIG. 9D are cross sectional views illustrating manufacturing process steps for a data pad region of a COT type LCD device according to a second embodiment of the present invention.

First, as illustrated in FIG. 9A, after forming the gate line (not shown), a gate electrode 512a, a gate pad (522 of FIG. 6A), and the gate metal 532 on the substrate 511, an inorganic insulating material such as silicon oxide $SiO_x$ or silicon nitride $SiN_x$ is deposited on an entire surface of the substrate 511 including the gate electrode 512a, thereby forming the gate insulating layer 513. The gate metal 532 is formed on a portion of the data pad, wherein the gate metal 532 is separately formed substantially in an island-like shape. Then, an amorphous silicon (a-Si:H) layer and a low-resistance metal layer are sequentially deposited and patterned on the gate insulating layer 513, thereby forming a semiconductor layer 514, the data line (not shown), source/drain electrodes 515a/515b, and the data pad 525. The data pad 525 is formed inside a margin of the substrate 511 to expose the gate metal 532 that is formed in the margin of the substrate 511 beyond the data pad 525. When etching the data pad 525, the amorphous silicon layer 514 positioned below the data pad 525 is also etched.

Figure 9B:
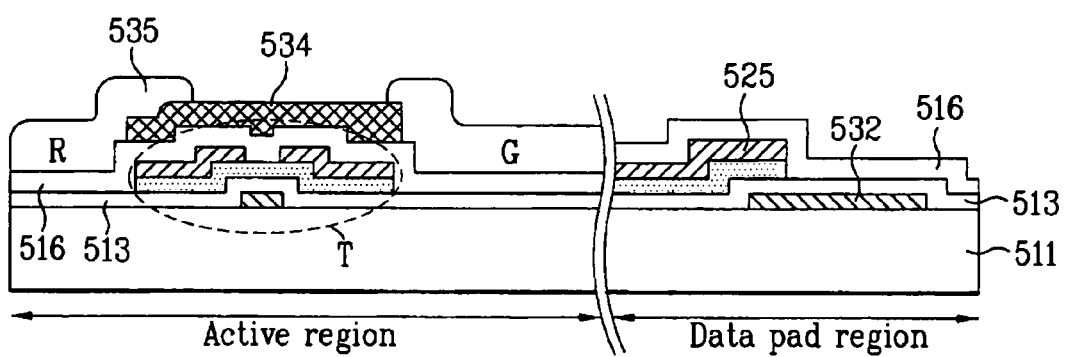

Subsequently, as illustrated in FIG. 9B, an inorganic insulating material layer of, for example, silicon oxide $SiO_x$ or silicon nitride $SiN_x$, is deposited on the entire surface of the substrate 511 including the source/drain electrodes 515a/515b, thereby forming the passivation layer 516. After that, a black matrix layer 534 and a color filter layer 535 are formed in the active region. The color filter layer 535 is formed in the portion corresponding to the pixel regions, and the black matrix layer 534 is formed in other portions of the substrate where incident light is to be blocked.

Figure 9C:
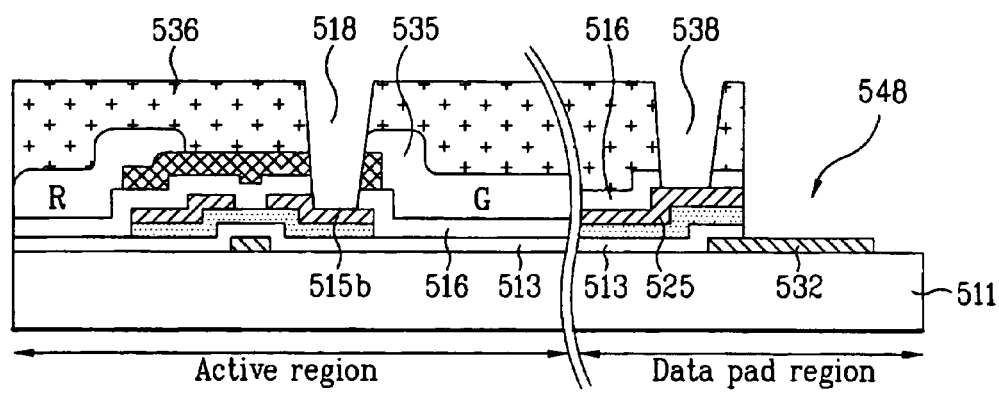

Next, as illustrated in FIG. 9C, an organic insulating material layer having the photosensitive characteristics, for example, photoacryl, is thickly coated on the entire surface of the substrate 511 including the color filter layer 535, to obtain a substantially planar surface on the entire surface of the substrate, thereby forming the overcoat layer 536. Subsequently, light is irradiated onto predetermined portions of the overcoat layer 536, and the predetermined portions irradiated with light are developed, thereby forming a desired pattern. Then, the passivation layer 516 and the gate insulating layer 513 corresponding the patterned overcoat layer 536 is selectively etched, thereby forming a contact hole 518, and first/second/third pad open regions (528/538/548 of FIG. 6C, respectively). That is, the passivation layer 516 and the overcoat layer 536 are removed above the drain electrode 515b of the active region to form the contact hole 518; the gate insulating layer 513, the passivation layer 516, and the overcoat layer 536 are removed above the gate pad 522 of the gate pad region, thereby forming the first pad open region 528; the second pad open region 538 is formed in the data pad region by removing the passivation layer 516 and the overcoat layer 536 positioned above the data pad 525; and the third pad open region 548 is formed by removing the gate insulating layer 513, the passivation layer 516, and the overcoat layer 536 positioned above the gate metal 532. In this case, the gate insulating layer 513, the passivation layer 516, and the overcoat layer 536 are patterned in the same process step, thereby simplifying the process.

Figure 9D:
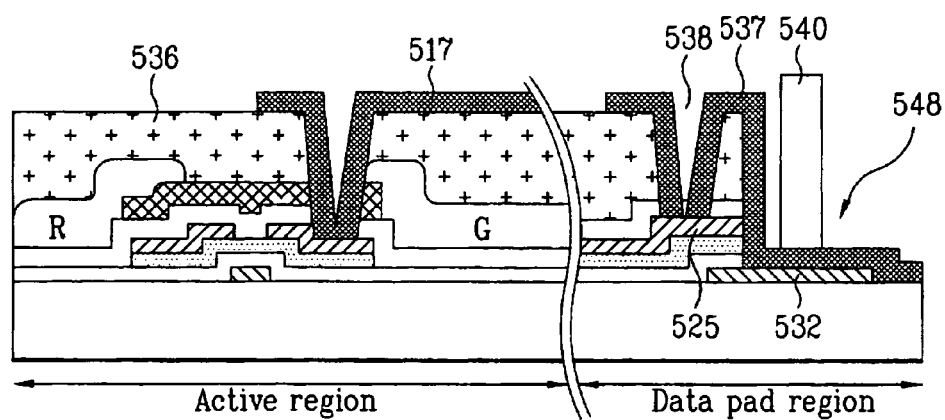

Next, as illustrated in FIG. 9D, a transparent conductive material such as ITO or IZO is deposited on the entire surface of the substrate 511 including the overcoat layer 536, and then the deposited transparent conductive material is patterned, thereby forming a pixel electrode 517 and first/second transparent conductive layers (527/537 of FIG. 6D). The pixel electrode 517 and the first/second transparent conductive layers may be formed at the same time. The resulting pixel electrode 517 is in contact with the drain electrode 515b through the contact hole 518. The second transparent conductive layer 537 is in contact with the data pad 525 through the second pad open region 538 and is also in contact with the gate metal 532 through the third pad open region 548. That is, the data pad 525 is electrically connected with the gate metal 532 by the second transparent conductive layer 537. Subsequently, a sealant 540 is formed on the second transparent conductive layer 537, wherein the sealant 540 is used to bond the two substrates to each other.

Figure 10A:
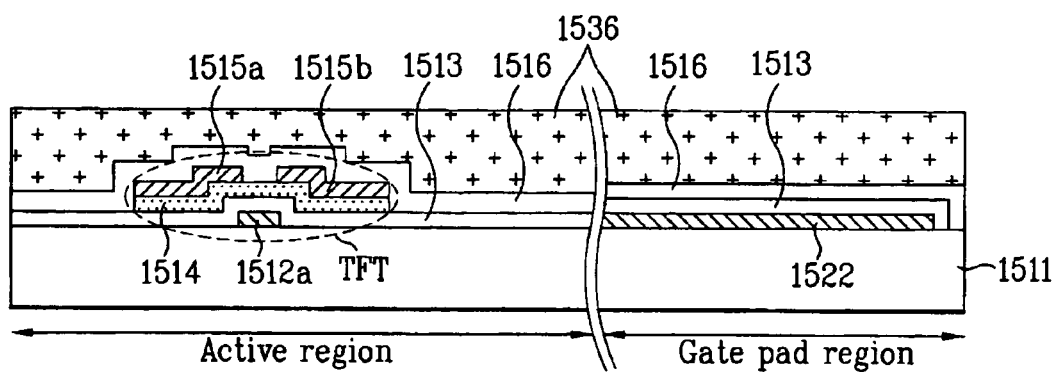
FIG. 10A to FIG. 10C are cross sectional views illustrating manufacturing process steps of a gate pad region of an LCD device according to a third embodiment of the present invention.
Figure 10B:
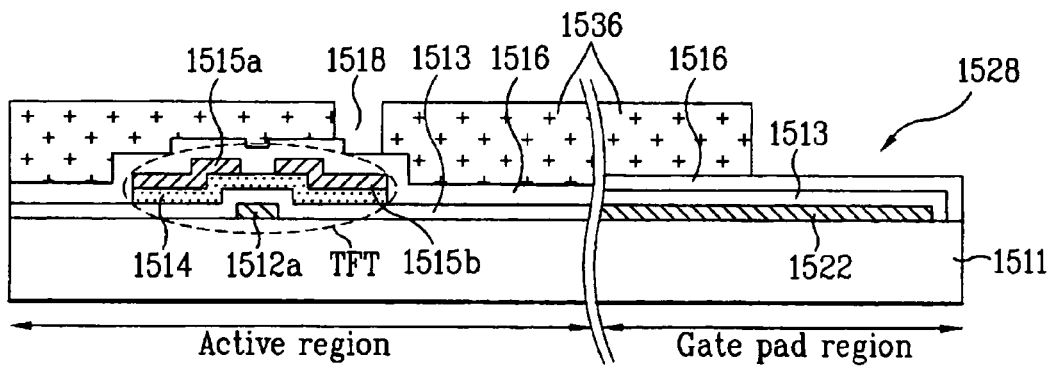
Figure 10C:
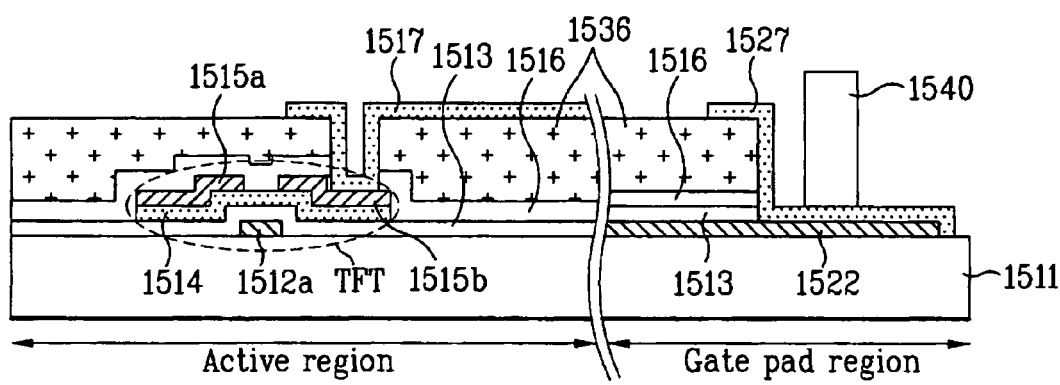
Figure 11A:
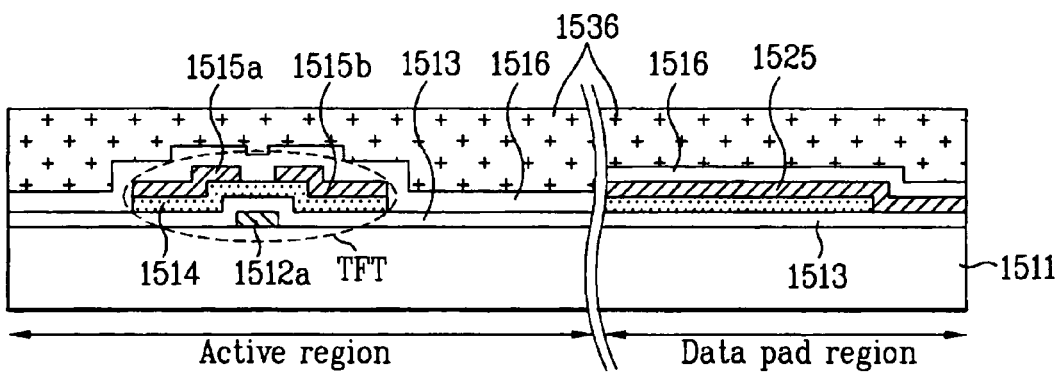
FIG. 11A to FIG. 11C are cross sectional views illustrating manufacturing process steps of a data pad region of an LCD device according to a third embodiment of the present invention.
Figure 11B:
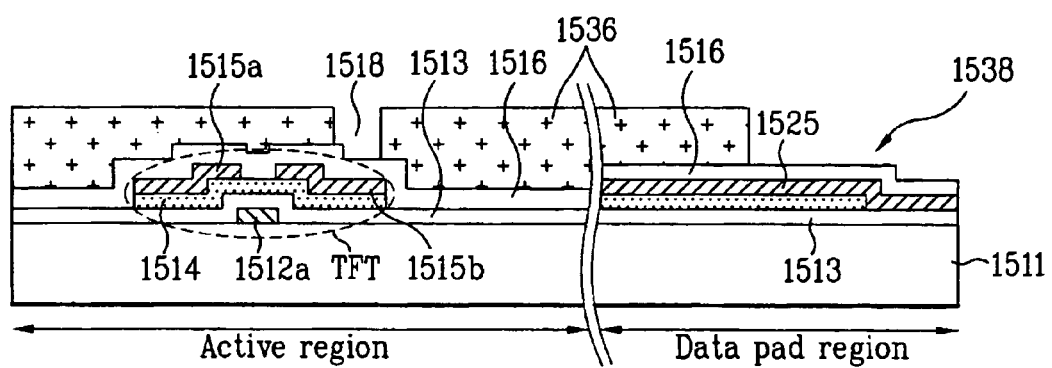
Figure 11C:
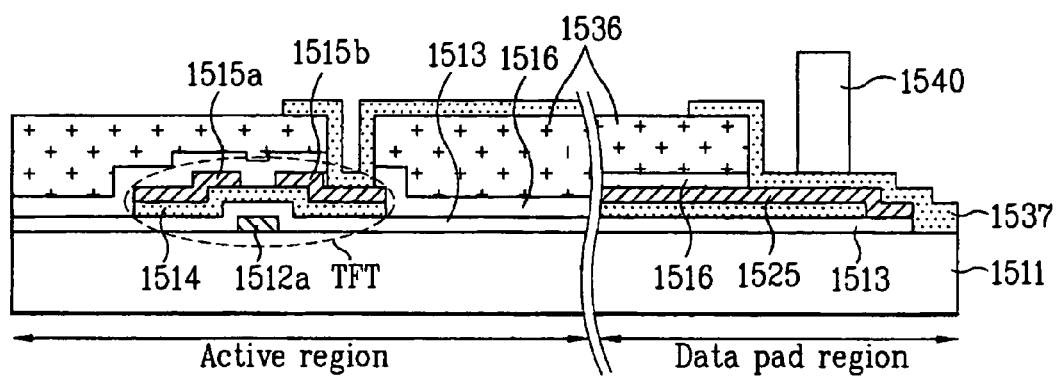

FIG. 10A to FIG. 10C are cross sectional views illustrating steps of an exemplary manufacturing processfor a gate pad region of an LCD device according to a third embodiment of the present invention. FIG. 11A to FIG. 11C are cross sectional views illustrating steps of an exemplary manufacturing process for a data pad region of an LCD device according to the third embodiment of the present invention. Unlike the first and second embodiments of the present invention, the LCD device according to the third embodiment of the present invention has no color filter layer or black matrix layer on a substrate 1511. In the LCD device according to the third embodiment of the present invention, an overcoat layer 1536 is formed directly on a passivation layer 1516 without forming the color filter layer and the black matrix layer. The overcoat layer 1536 forms a substantially planar surface on the passivation layer 1516, which is formed of an inorganic insulating material. In addition, the overcoat layer 1536 can be used as substitute for the passivation layer 1516 in case the overcoat layer 1536 is formed on a thin film transistor TFT without forming the additional passivation layer.

The LCD device according to the third embodiment of the present invention includes a gate line (not shown), a gate electrode 1512a, a gate pad 1522, a gate insulating layer 1513, a data line (not shown), a data pad 1525, the thin film transistor TFT, a passivation layer 1516, a overcoat layer 1536, a pixel electrode 1517, a first transparent conductive layer 1527, and a second transparent conductive layer 1537. The gate insulating layer 1513 is formed on an entire surface of the substrate 1511 including the gate line (not shown), and the data line (not shown) and the data pad 1525 are formed on the gate insulating layer 1513. Also, the TFT is formed at a crossing portion of the gate line and the data line, and the passivation layer 1516 is formed on the entire surface of the substrate 1511 including transistor TFT. Then, the overcoat layer 1536 is formed on the entire surface of the substrate 1511 including the passivation layer 1516, wherein the overcoat layer 1536 has substantially the same pattern as the passivation layer 1516. The pixel electrode 1517 is in contact with the thin film transistor TFT through the passivation layer 1516 and the overcoat layer 1536. In addition, the first transparent conductive layer 1527 covers the gate pad 1522 through a first pad open region 1528. The second transparent conductive layer 1537 covers the data pad 1525 through a second pad open region 1538.

A method for manufacturing the LCD device according to the third embodiment of the present invention will be described as follows.

As illustrated in FIG. 10A and FIG. 11A, a low-resistance metal material layer is deposited on the substrate 1511 by a deposition method such as sputtering, and then the deposited low-resistance metal material layer is patterned by photolithography, thereby forming the gate line (not shown), the gate electrode 1512, and the gate pad 1522. Then, an inorganic insulating material such as silicon nitride $SiN_x$ or silicon oxide $SiO_x$ is deposited on the substrate having the patterned metal layer to form the gate insulating layer 1513. After that, an amorphous silicon (a-Si:H) layer is formed on the gate insulating layer 1513 above the gate electrode 1522, thereby forming a semiconductor layer 1514. Then, a low-resistance metal material layer is deposited and patterned on the semiconductor layer 1514 to form the data line (not shown), source/drain electrodes 1515a/1515b, and the data pad 1525. Accordingly, the structure having the gate electrode 1512a, the semiconductor layer 1514, and the source/drain electrodes 1515a/1515b forms the thin film transistor TFT. Subsequently, an inorganic insulating material such as silicon oxide $SiO_x$ or silicon nitride $SiN_x$ is deposited on the entire surface of the substrate including the thin film transistor TFT, thereby forming the passivation layer 1516.

After that, as illustrated in FIG. 10B and FIG. 11B, an organic insulating material having photosensitive characteristics, for example, photoacryl, is coated on the passivation layer 1516, to form overcoat layer 1536. After forming the desired pattern by exposing and developing the overcoat layer 1536, as illustrated in FIG. 10C and FIG. 11C, the passivation layer 1516 or the gate insulating layer 1513 exposed by the pattern of the overcoat layer 1536 is dry-etched to form the contact hole 1518 and the first/second pad open regions 1528/1538. Through one process, the contact hole 1518 and the first/second pad open regions 1528/1538 are formed by patterning the gate insulating layer 1513, the passivation layer 1516, and the overcoat layer 1536, thereby simplifying the fabrication process. Accordingly, the overcoat layer 1536 functions as both a photoresist and a layered substance.

Next, a transparent conductive material such as ITO or IZO is deposited and patterned on the entire surface of the substrate including the overcoat layer 1536, thereby forming the pixel electrode 1517, which is in contact with the drain electrode 1515b through the contact hole 1518, and the first/second transparent conductive layers 1527/1537, which are in contact with the respective gate pad 1522 and the data pad 1525 through the first/second pad open regions 1528/1538. Thereafter, a sealant 1540 is formed on the first/second transparent conductive layers 1527/1537 of the pad region, wherein the sealant 1540 functions as an adhesive. Then, the substrate 1511 is positioned opposite to another glass substrate (not shown) having the black matrix layer and the color filter layer formed thereon. After that, the two substrates are bonded to each other, and a liquid crystal layer is formed between the two substrates, thereby completing the LCD device according to the third embodiment of the present invention.

Figure 12A:
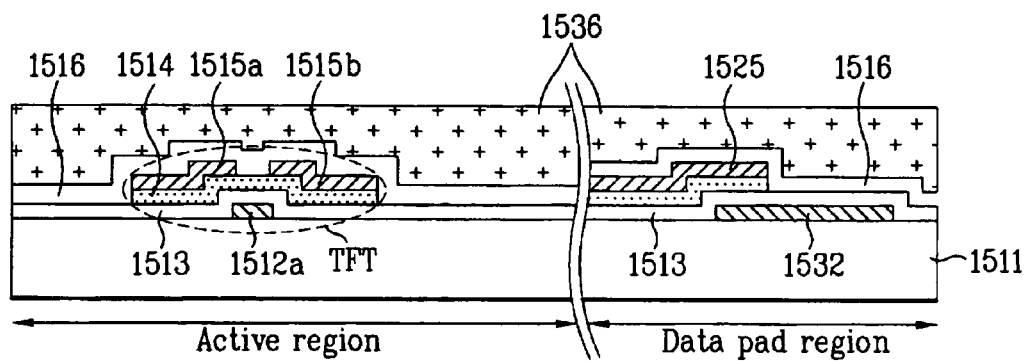
FIG. 12A to FIG. 12C are cross sectional views illustrating manufacturing process steps of a data pad region of an LCD device according to a fourth embodiment of the present invention.
Figure 12B:
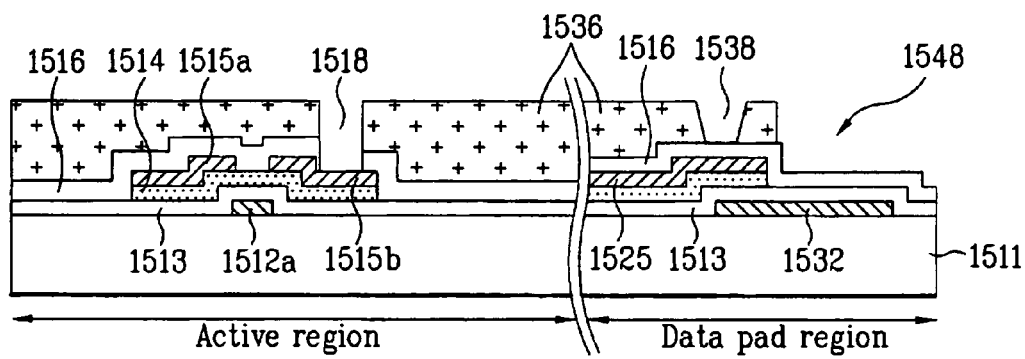
Figure 12C:
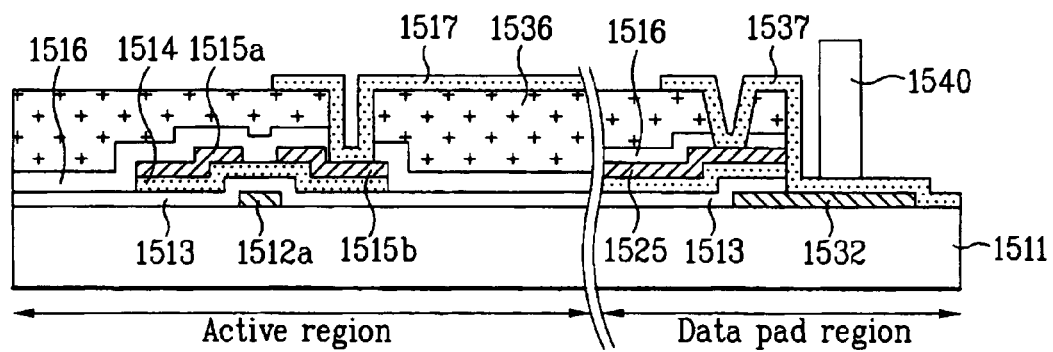

FIG. 12A to FIG. 12C are cross sectional views illustrating steps of an exemplary manufacturing process for a data pad region of an LCD device according to a fourth embodiment of the present invention. Like the LCD device according to the third embodiment of the present invention, for the LCD device according to the fourth embodiment of the present invention, a black matrix layer and a color filter layer are not formed on a thin film transistor TFT array substrate. However, as illustrated in FIG. 12C, the LCD device according to the fourth embodiment of the present invention further includes a gate metal 1532 formed in a data pad region. In describing the fourth embodiment of the present invention, the same or like parts as those in the third embodiment of the present invention will be referred to as the same reference numbers. Also, a gate pad region will be explained with reference to FIG. 10A to FIG. 10C.

The data pad region of the LCD device according to the fourth embodiment of the present invention includes the gate metal 1532, a gate insulating layer 1513, a data pad 1525, a passivation layer 1516, an overcoat layer 1536, and a second transparent conductive layer 1537. The gate metal 1532 is additionally formed on the data pad region of the substrate 1511, and the gate insulating layer 1513 is formed on an entire surface of the substrate 1511 including the gate metal 1532. Also, the data pad 1525 extending from a data line is formed on the gate insulating layer 1513. The passivation layer 1516 and the overcoat layer 1536 are disposed on the data pad 1525. The second transparent conductive layer 1537 prevents the gate metal 1532 from being exposed and being oxidized, and electrically connects the gate metal 1532 with the data pad 1525. Herein, the gate metal 1532 is formed in a separate island shape and is formed at the same layer as a gate line of an active region.

An exemplary method for manufacturing the LCD device according to the fourth embodiment of the present invention will be described.

First, as illustrated in FIG. 12A, a thin film transistor TFT is formed by sequentially depositing a gate electrode 1512a, the gate insulating layer 1513, a semiconductor layer 1514, and source/drain electrodes 1515a/1515b. Then, the passivation layer 1516 is formed on the entire surface of the substrate 1511 including the thin film transistor TFT. At this stage, the gate insulating layer 1513 and the passivation layer 1516 are formed on the entire surface of the substrate 1511 in that the gate insulating layer 1513 and the passivation layer 1516 are not yet patterned. The gate insulating layer 1513 and the passivation layer 1516 are formed of an inorganic insulating material such as silicon nitride $SiN_x$ or silicon oxide $SiO_x$. The gate metal 1532 is formed at the same layer as the gate electrode 1512, wherein the island-shaped gate metal 1532 is formed in the portion for the data pad. Next, an organic insulating material layer having photosensitive characteristics, for example, photoacryl, is thickly coated on the entire surface of the substrate 1511 including the passivation layer 1516, thereby forming the overcoat layer 1536. Alternatively, it is possible to form the overcoat layer 1536 directly on the thin film transistor TFT without forming the passivation layer 1516, whereby the overcoat layer 1536 substitutes for the passivation layer 1516.

Subsequently, as illustrated in FIG. 12B, the overcoat layer 1536 is patterned by irradiating light onto predetermined portions of the overcoat layer 1536, and by developing and etching the overcoat layer 1536 corresponding to the predetermined portions. After that, the passivation layer 1516 and the gate insulating layer 1513 exposed by the pattern of the overcoat layer 1536 is selectively dry-etched to form the contact hole 1518 and the first/second/third pad open regions (1528 of FIG. 6C, and 1538/1548 of FIG. 12B). That is, it is possible to form the contact hole 1518 in the active region and the pad open region in the pad region by simultaneously patterning the overcoat layer 1536, the passivation layer 1516, and the gate insulating layer 1513 with one photolithography process, thereby simplifying manufacturing.

Next, as illustrated in FIG. 12C, a transparent conductive material layer such as ITO or IZO is deposited and patterned on the entire surface of the substrate including the overcoat layer 1536, thereby forming the pixel electrode 1517, the first transparent conductive layer (1527 of FIG. 6D), and the second transparent conductive layer (1537 of FIG. 12C) at the same time. The resulting second transparent conductive layer 1537 is in contact with the data pad 1525 and the gate metal 1532 through the respective second and third pad open regions 1538 and 1548, so that the data pad 1525 is electrically connected with the gate metal 1532.

Then, a sealant 1540 of an adhesive is formed on the second transparent conductive layer 1537, thereby completing the TFT array substrate of the LCD device according to the fourth embodiment of the present invention.

In case of the COT type LCD device, it is necessary to form the overcoat layer to create a substantially planar surface on the substrate. In this case, the patterning process of the overcoat layer is performed when etching the gate insulating layer and the passivation layer for forming the contact hole and the pad open region, so that it is possible to simplify the manufacturing process. That is, the number of masks required is decreased, thereby improving the efficiency in the manufacturing process and decreasing the manufacturing cost.

Also, if the overcoat layer and the lower insulating layer are etched at the same time, the lower metal layers of the gate pad and the data pad function as the etching stopper, so that it is possible to form the gate pad and the data pad under a stable state.

The overcoat layer may be additionally formed on the passivation layer of the general LCD device, or the overcoat layer may be formed in the general LCD device without forming the passivation layer. In this case, it is possible to form the overcoat layer, the passivation layer, and the gate insulating layer at the same time, thereby simplifying the manufacturing process.

In a subsequent fabrication step common to the third and fourth embodiments, the TFT substrate is positioned opposite to the color filter substrate, and then the two substrates are bonded to each other. After that, a liquid crystal layer is formed between the two substrates, thereby completing the LCD device. A sealant 540 is formed on the first and second transparent conductive layers 527 and 537 of the pad regions for completely bonding the two substrates to each other.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An LCD device comprising:
   a gate line and a gate pad on a substrate;
   a gate insulating layer on an entire surface of the substrate including the gate line except the gate pad;
   a data line and a data pad on the gate insulating layer;
   a thin film transistor at a crossing portion of the gate line and the data line;
   a passivation layer on the entire surface of the substrate including the thin film transistor except the gate pad and data pad;
   an overcoat layer on the passivation layer;
   a pixel electrode in contact with the thin film transistor through a contact hole formed in the passivation layer and the overcoat layer;
   a first transparent conductive layer directly on an open region of the gate pad to an edge thereof, wherein the first transparent conductive layer is formed at a region where all the gate insulating layer, the a passivation layer and the overcoat layer is removed on said open region including to said edge; and
   a second transparent conductive layer directly on an open region of the data pad to an edge thereof, wherein the second transparent conductive layer is formed at a region where all the a passivation layer and the overcoat layer is removed on said open region including to said edge, wherein a semiconductor layer is below the data pad.

2. The LCD device of claim 1, further comprising a sealant disposed on the first and second transparent conductive layers.

3. The LCD device of claim 1, wherein the overcoat layer has photosensitive characteristics.

4. The LCD device of claim 1, wherein the overcoat layer includes photoacryl.

5. The LCD device of claim 1, further comprising a black matrix layer and a color filter layer between the passivation layer and the overcoat layer.

6. The LCD device of claim 5, wherein the black matrix layer includes a carbon-type opaque organic material.

7. The LCD device of claim 1, further comprising a gate metal formed in a data pad region.

8. The LCD device of claim 7, wherein the gate metal is formed at the same layer as the gate line.

9. The LCD device of claim 7, wherein the second transparent conductive layer is in contact with the data pad and the gate metal through a pad open region.

10. A method for manufacturing an LCD device comprising:
    forming a gate line, a gate electrode, and a gate pad on a substrate;
    forming a gate insulating layer on an entire surface of the substrate including the gate line;
    forming a semiconductor layer on the gate insulating layer above the gate electrode;
    forming a data line, a source electrode, a drain electrode, and a data pad, wherein the data line is in perpendicular to the gate line;
    forming a passivation layer on the entire surface of the substrate including the data line;
    forming an overcoat layer on the entire surface of the substrate including the passivation layer;
    forming a contact hole, a first pad open region having an edge, and a second pad open region having and edge, wherein the contact hole is formed at a region where selectively the overcoat layer, the passivation layer, and the gate insulating layer is removed, wherein the first pad open region including said edge is formed at a region where all the gate insulating layer, the passivation layer and the overcoat layer is removed including to said edge, wherein the second pad open region is formed at a region where all the passivation layer and the overcoat layer is removed including to said edge; and
    forming a pixel electrode, a first transparent conductive layer, and a second transparent conductive layer, wherein the pixel electrode is in contact with the drain electrode through the contact hole, the first transparent conductive layer is in contact with the gate pad through the first pad open region to including said edge and the second transparent conductive layer is in contact with the data pad through the second pad open region to including said edge.

11. The method of claim 10, further comprising forming a black matrix layer and a color filter layer on predetermined portions of the passivation layer after forming the passivation layer.

12. The method of claim 10, wherein the forming the passivation layer includes forming an inorganic insulating material.

13. The method of claim 10, wherein the forming the overcoat layer includes forming an organic insulating material.

14. The method of claim 10, wherein the forming the overcoat layer includes forming a layer having photoacryl.

15. The method of claim 14, wherein the forming the contact hole, the first pad open region, and the second pad open region includes:
    developing the overcoat layer, wherein the developing includes selectively removing the overcoat layer on a contact hole region, a gate pad region and a data pad region; and
    forming the contact hole and the first/second pad open regions by etching the passivation layer using the developed overcoat layer as a mask.

16. The method of claim 15, wherein the forming the first pad open further includes etching the gate insulating layer using the developed overcoat layer as a mask.

17. The method of claim 10, further comprising forming a gate metal below the data pad.

18. The method of claim 16, wherein the forming the gate line and the forming the gate metal are performed at the same time.

19. The method of claim 16, wherein the forming the contact hole, the first pad open region, and the second pad open region includes forming a third pad open region by removing the overcoat layer, the passivation layer, and the gate insulating layer above the gate metal.

20. The method of claim 16, wherein the second transparent conductive layer is in contact with the data pad through the second pad open region, and in contact with the gate metal through the third pad open region.

* * * * *